(12) United States Patent
Shamoto et al.

(10) Patent No.: US 10,968,530 B2
(45) Date of Patent: Apr. 6, 2021

(54) ELECTROPLATING DEVICE

(71) Applicant: EBARA CORPORATION, Tokyo (JP)

(72) Inventors: Mitsuhiro Shamoto, Tokyo (JP); Tsutomu Nakada, Tokyo (JP); Masashi Shimoyama, Tokyo (JP)

(73) Assignee: EBARA CORPORATION, Tokyo (JP)

(*) Notice: Subject to any disclaimer, the term of this patent is extended or adjusted under 35 U.S.C. 154(b) by 101 days.

(21) Appl. No.: 16/260,153

(22) Filed: Jan. 29, 2019

(65) Prior Publication Data
US 2019/0256997 A1   Aug. 22, 2019

(30) Foreign Application Priority Data
Feb. 22, 2018 (JP) .............................. JP2018-029810

(51) Int. Cl.
| C25D 17/12 | (2006.01) |
| H01L 21/67 | (2006.01) |
| H01L 21/687 | (2006.01) |
| C25D 17/06 | (2006.01) |
| C25D 5/08 | (2006.01) |
| C25D 21/00 | (2006.01) |
| C25D 17/00 | (2006.01) |

(52) U.S. Cl.
CPC .............. C25D 17/06 (2013.01); C25D 5/08 (2013.01); C25D 17/001 (2013.01); C25D 17/005 (2013.01); C25D 17/008 (2013.01); C25D 21/00 (2013.01); H01L 21/6723 (2013.01); H01L 21/687 (2013.01)

(58) Field of Classification Search
CPC ..... C25D 17/008; C25D 17/001; C25D 7/123
See application file for complete search history.

(56) References Cited

U.S. PATENT DOCUMENTS

| 2010/0212694 A1* | 8/2010 | Keigler ................ C25D 17/001 |
| | | 134/18 |
| 2014/0166492 A1* | 6/2014 | Shimoyama ........... C25D 21/10 |
| | | 205/82 |
| 2016/0194780 A1* | 7/2016 | Nagai ................. H01L 21/2885 |
| | | 204/242 |

FOREIGN PATENT DOCUMENTS

| JP | H0329876 | 4/1991 |
| JP | H09125294 | 5/1997 |
| JP | 2005029863 | 2/2005 |

* cited by examiner

*Primary Examiner* — Brian W Cohen
*Assistant Examiner* — Ho-Sung Chung
(74) *Attorney, Agent, or Firm* — JCIPRNET

(57) ABSTRACT

In-plane uniformity of a membrane electroplated on a polygon substrate is improved. An electroplating device includes an anode holder configured to hold an anode, a substrate holder configured to hold a polygon substrate, and a regulation plate provided between the anode holder and the substrate holder. The regulation plate has a body portion having a first polygon opening following an outer shape of the polygon substrate, and wall portions protruding on a substrate holder side from edges of the first polygon opening. The wall portions protrude over a first distance on the substrate holder side in first regions which contain middle portions of sides of the first polygon opening, and are notched in second regions which contain corner portions of the first polygon opening, or protrude over a second distance smaller than the first distance on the substrate holder side.

4 Claims, 12 Drawing Sheets

ELECTROPLATING DEVICE

CROSS-REFERENCE TO RELATED APPLICATION

This application claims the priority benefit of Japanese application serial no. 2018-029810, filed on Feb. 22, 2018. The entirety of the above-mentioned patent application is hereby incorporated by reference herein and made a part of this specification.

BACKGROUND

Technical Field

The disclosure relates to an electroplating device.

Related Art

Conventionally, a wiring is formed in a fine groove for wiring, a hole, or a resist opening portion provided on a surface of a substrate such as a semiconductor wafer or the like, or a bump (a protruding electrode) electrically connected to an electrode of a package or the like is formed on the surface of the substrate. As a method for forming the wiring and the bump, for example, an electrolytic electroplating method, a vapor deposition method, a printing method, a ball bump method or the like is known. With an increase in the number of I/O of semiconductor chips and narrow pitch, the electrolytic electroplating method is capable of miniaturization and has a relatively stable performance is used often.

When the wiring or the bump is formed by the electrolytic electroplating method, a seed layer (a power feeding layer) with a low electric resistance is formed on a barrier metal surface provided in the groove for wiring, the hole, or the resist opening portion on the substrate. On a surface of the seed layer, an electroplating membrane grows.

Generally, an electroplated substrate has electric contacts on its periphery portions. That is, an electrical current flows from the middle of the electroplated substrate to the periphery portions. As a distance from the middle of the substrate increases, an electrical potential gradually decreases in accordance with the electric resistance of the seed layer, and a lower electrical potential is generated on the periphery portions of the substrate than on the central portion of the substrate. This phenomenon that a reduction electrical current of metal ions, that is, an electroplate electrical current concentrates on the periphery portion of the substrate due to an electrical potential difference between the substrate centre and the periphery portion is called a terminal effect.

Furthermore, as a shape of the substrate electroplated by the electrolytic electroplating method, a circular substrate or a quadrilateral substrate is known (for example, see patent literature 1: Japanese Laid-open No. 09-125294 and patent literature 2: Japanese Laid-open No. 03-029876).

In the circular substrate, distances from a middle portion of the circular substrate to the periphery portions of the substrate and distances between adjacent electric contacts are the same over an entire circumference of the substrate. Therefore, the terminal effect at the time of electroplating the circular substrate is generated substantially similarly over the entire circumference of the substrate. Accordingly, when the circular substrate is electroplated, an electroplating speed in the central portion of the substrate is reduced, and a membrane thickness of an electroplating membrane in the central portion of the substrate is thinner than the membrane thickness of the electroplating membrane in the periphery portions of the substrate. Conventionally, in order to suppress a reduction of in-plane uniformity of the membrane thickness caused by the terminal effect, an electrical current is supplied to the electric contacts evenly arranged on the periphery portions of the circular substrate, and for example, a regulation plate disclosed in patent literature 3 (Japanese Laid-open No. 2005-029863) is used to regulate an electric field added to the circular substrate, that is, to regulate an advection of electro-active ions.

However, in a polygon substrate, when electric contacts are arranged on periphery portions of all the sides of the polygon, distances between neighboring electric contacts are different according to locations. That is, the distances between the neighboring electric contacts near vertexes of the polygon substrate are shorter than the distances between the neighboring electric contacts on middle portions (middle portions between the vertexes) of the sides of the polygon substrate. Accordingly, because an electrical quantity is increased compared with the middle portions of the sides of the polygon substrate (the middle portions between the vertexes), electro-active ions on a substrate surface are further consumed and a concentration is reduced at an initial stage of the electroplating. In addition, the vicinities of the vertexes are surrounded by structural components of a substrate holder, such as a seal or the like which protects the electric contacts from electroplating liquid, and thus the electro-active ions are difficult to be supplied to the substrate surface. Therefore, in the polygon substrate, there is a tendency that final electroplating membrane thickness becomes small at regions near corner portions of which distances from a central portion are relatively long.

SUMMARY

According to an embodiment of the disclosure, an electroplating device is provided, and the electroplating device includes an anode holder configured to hold an anode, a substrate holder configured to hold a polygon substrate, and a regulation plate provided between the anode holder and the substrate holder. The regulation plate has a body portion having a first polygon opening following an outer shape of the polygon substrate, and wall portions protruding on a substrate holder side from edges of the first polygon opening. The wall portions protrude over a first distance on the substrate holder side in first regions which contain middle portions of sides of the first polygon opening, and are notched in second regions which contain corner portions of the first polygon opening, or protrude over a second distance smaller than the first distance on the substrate holder side.

DESCRIPTION OF THE EMBODIMENTS

Figure 1:
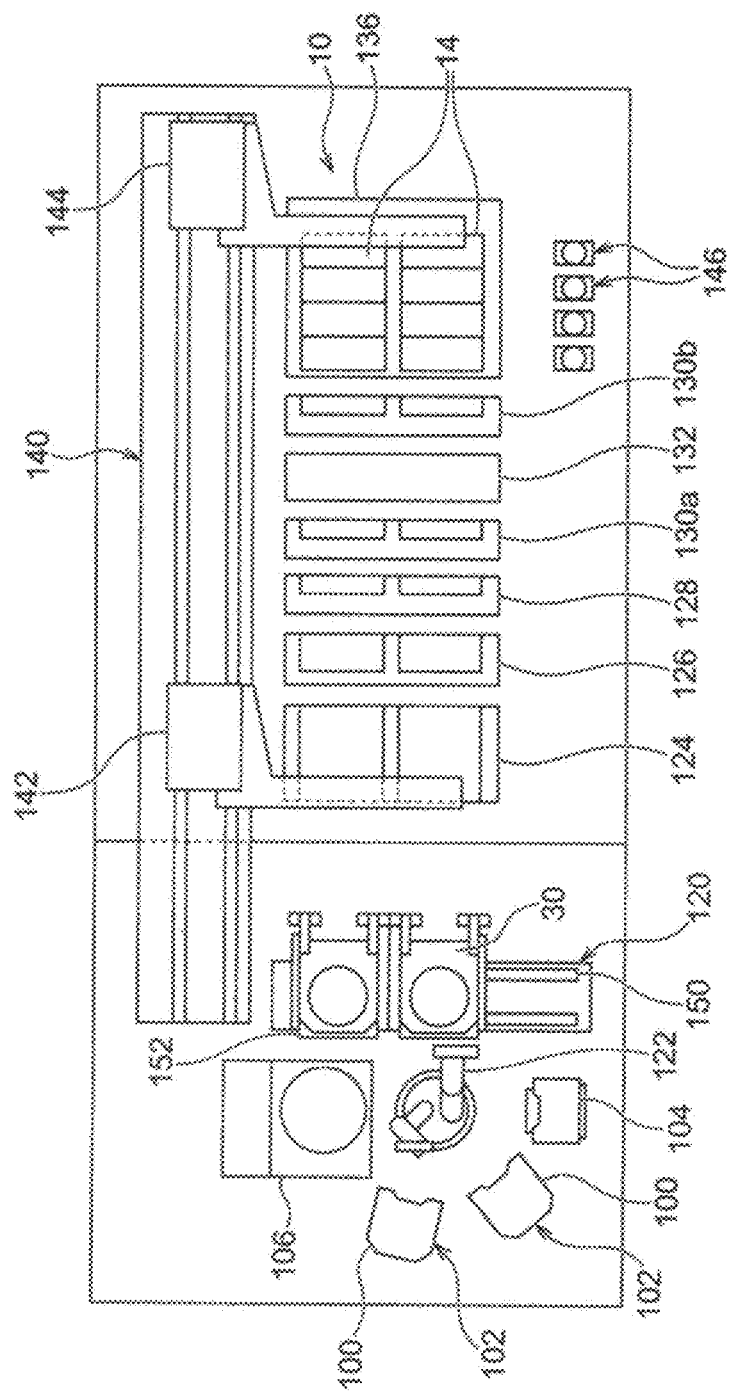
FIG. 1 is an overall arrangement diagram of an electrolytic electroplating device of an embodiment.

The disclosure improves the in-plane uniformity of a membrane electroplated on the polygon substrate.

According to an embodiment of the disclosure, an electroplating device is provided, and the electroplating device includes an anode holder configured to hold an anode, a substrate holder configured to hold a polygon substrate, and a regulation plate provided between the anode holder and the substrate holder. The regulation plate has a body portion having a first polygon opening following an outer shape of the polygon substrate, and wall portions protruding on a substrate holder side from edges of the first polygon opening. The wall portions protrude over a first distance on the substrate holder side in first regions which contain middle portions of sides of the first polygon opening, and are notched in second regions which contain corner portions of the first polygon opening, or protrude over a second distance smaller than the first distance on the substrate holder side. According to an embodiment of the disclosure, the in-plane uniformity of the membrane electroplated on the polygon substrate can be improved.

According to an embodiment of the disclosure, in the electroplating device, the first regions of the wall portions viewed from a direction perpendicular to a plate surface of the body portion are trapezoidal shapes with outside sides which are longer.

According to an embodiment of the disclosure, the electroplating device further includes a diaphragm which is arranged to block the first polygon opening of the regulation plate, allows metal ions to permeate and prevents additives from permeating.

According to an embodiment of the disclosure, the electroplating device further includes an anode mask mounted to the anode holder. The anode mask has an anode mask body portion having a second polygon opening following the outer shape of the polygon substrate, and anode mask wall portions protruding on the substrate holder side from edges of the second polygon opening. The anode mask wall portions protrude over a third distance on the substrate holder side in third regions which contain middle portions of sides of the second polygon opening, and are notched in fourth regions which contain corner portions of the second polygon opening, or protrude over a fourth distance smaller than the third distance on the substrate holder side.

Next, embodiments of the disclosure are described with reference to drawings. In the drawings described below, the same or equivalent configuration elements are denoted by the same symbols and repeated description is omitted.

FIG. 1 shows an overall arrangement diagram of an electroplating device of an embodiment. As shown in FIG. 1, the electroplating device has two cassette tables 102 on which a cassette 100 storing a substrate such as a semiconductor wafer or the like is loaded, an aligner 104 which aligns a location of an orientation flat or a notch or the like of the substrate with a predefined direction, and a spin-rinse-dryer 106 which makes the substrate after an electroplating processing rotate at a high speed to be dried. A substrate attaching/detaching portion 120 on which a substrate holder 30 is placed to attach and detach the substrate is provided near the spin-rinse-dryer 106. In the center of the units 100, 104, 106, 120, a substrate transferring device 122 consisting of a robot for transferring which transfers the substrate among the units is arranged.

The substrate attaching/detaching portion 120, a stocker 124 keeping and temporarily placing the substrate holder 30, a pre-wetting tank 126 for immersing the substrate in pure water, a pre-soaking tank 128 removing, by etching, an oxide membrane on a surface of an electrical conducting layer such as a seed layer or the like formed on a surface of the substrate, a first cleaning tank 130a cleaning the pre-soaked substrate along with the substrate holder 30 by cleaning liquid (pure water or the like), a blow tank 132 draining the liquid of the cleaned substrate, a second cleaning tank 130b cleaning the electroplated substrate along with the substrate holder 30 by the cleaning liquid, and an electroplating unit 10 are arranged in this order.

The electroplating unit 10 is formed by storing a plurality of electroplating tanks 14 inside an overflow tank 136. Each electroplating tank 14 stores one substrate inside and immerses the substrate into the electroplating liquid held inside to apply an electroplating such as a cooper electroplating or the like on the surface of the substrate.

The electroplating device has a substrate holder transferring device 140 which is located on a lateral side of each of these instruments to transfer the substrate holder 30 along with the substrate among these instruments and which adopts a linear motor method for example. The substrate holder transferring device 140 has a first transporter 142 which transfers the substrate among the substrate attaching/detaching portion 120, the stocker 124, the pre-wetting tank 126, the pre-soaking tank 128, the first cleaning tank 130a, and the blow tank 132, and a second transporter 144 which transfers the substrate among the first cleaning tank 130a, the second cleaning tank 130b, the blow tank 132, and the electroplating unit 10. The electroplating device may also include the first transporter 142 only without the second transporter 144.

Paddle drive devices 146 are arranged on a side of the substrate holder transferring device 140 opposite to the side on which the overflow tank 136 is sandwiched, and the paddle drive devices 146 drive paddles 16 (with reference to FIG. 2) which serve as stirring rods located inside each electroplating tank 14 and stirring the electroplating liquid inside the electroplating tanks 14.

The substrate attaching/detaching portion 120 includes a plate-like loading plate 152 which slides freely in a transverse direction along a rail 150. Two substrate holders 30 are loaded in parallel at a horizontal state on the loading plate 152, and after the substrate is delivered between one of the substrate holders 30 and the substrate transferring device 122, the loading plate 152 slides in the transverse direction and the substrate is delivered between another substrate holder 30 and the substrate transferring device 122.

Figure 2:
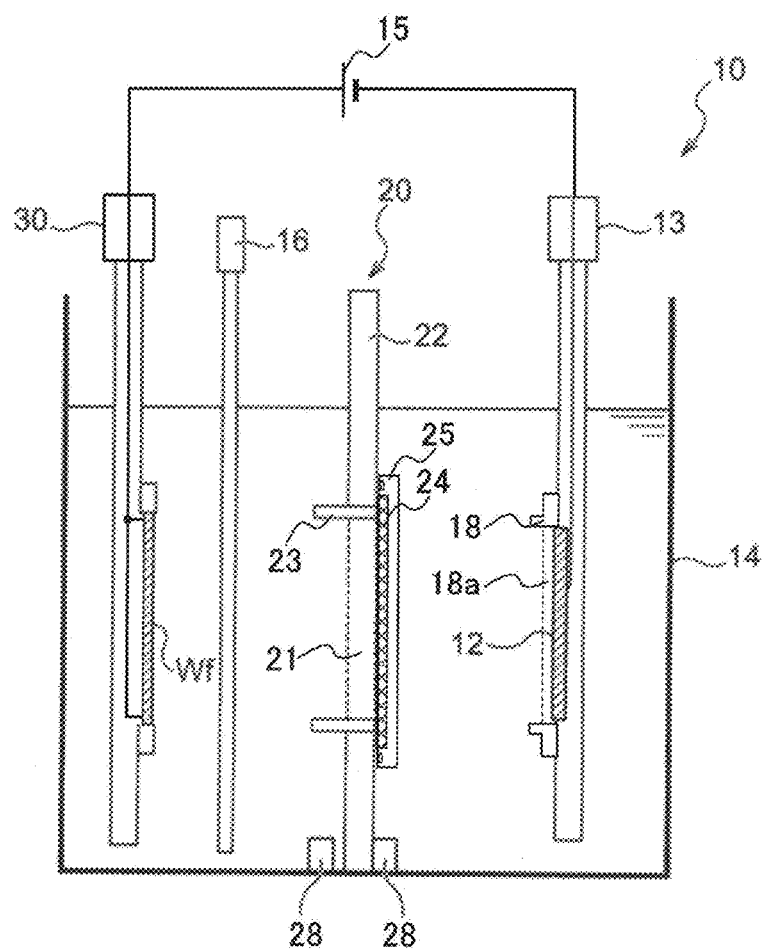
FIG. 2 is a schematic sectional side view (longitudinal sectional view) of a plating unit provided on an electroplating device.

FIG. 2 is a schematic sectional side view (a longitudinal sectional view) of the electroplating unit provided on the electroplating device shown in FIG. 1. As shown in FIG. 2, the electroplating unit 10 has the electroplating tanks 14 configured to accommodate the electroplating liquid, the substrate holder 30, and an anode holder 13, and an overflow tank (not shown). The substrate holder 30 is configured to hold a polygon substrate Wf, and the anode holder 13 is configured to hold an anode 12 having a metal surface. The polygon substrate Wf and the anode 12 are electrically connected via an electroplating electric power source 15, and an electroplating membrane is formed on a surface of the substrate Wf by the flowing of electrical current between the substrate Wf and the anode 12.

The anode holder 13 has an anode mask 18 which is used to regulate an electric field between the anode 12 and the substrate Wf. The anode mask 18 is, for example, a substantially plate-like member made from dielectric materials, and is provided on a front surface of the anode holder 13. Here, the front surface of the anode holder 13 is a surface on a side opposing the substrate holder 30. That is, the anode mask 18 is arranged between the anode 12 and the substrate holder 30. The anode mask 18 has, on a substantially middle portion, a polygon opening (a second polygon opening) 18a, through which the electrical current flowing between the anode 12 and the substrate Wf passes.

The electroplating unit 10 has a regulation plate 20 which is used to regulate the electric field between the substrate Wf and the anode 12, and the paddle 16 which is used to stir the electroplating liquid. The regulation plate 20 is arranged between the substrate holder 30 and the anode 12. Particularly, a lower end portion of the regulation plate 20 is inserted between a pair of protrusion members 28 provided on a floor surface of the electroplating tank 14, and the regulation plate 20 is fixed to the electroplating tank 14. In addition, the regulation plate 20 has an arm (not shown in the diagram) protruding outward near an upper end, and may be suspended and supported by hooking the arm on an upper surface of a peripheral wall of the stocker 124 inside the stocker 124 shown in FIG. 1. The paddle 16 is arranged between the substrate holder 30 and the regulation plate 20.

Figure 3A:
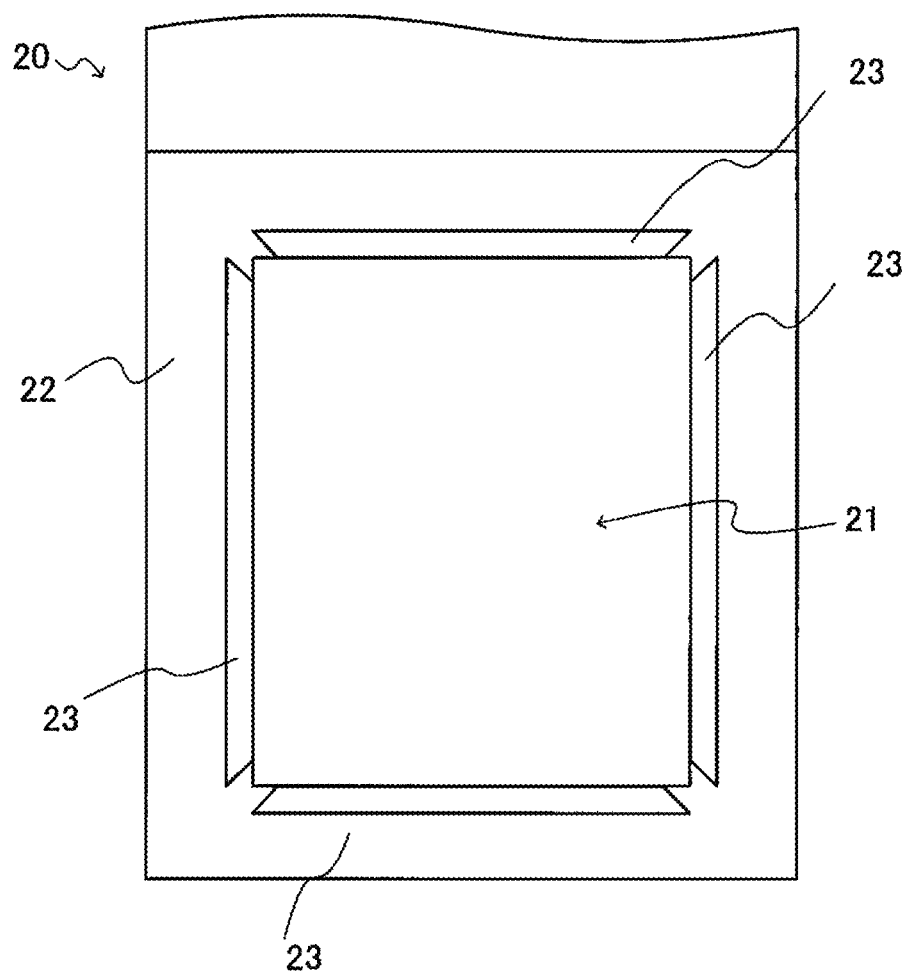
FIG. 3A is a diagram showing one example of a regulation plate of an embodiment from a substrate side.
Figure 3B:
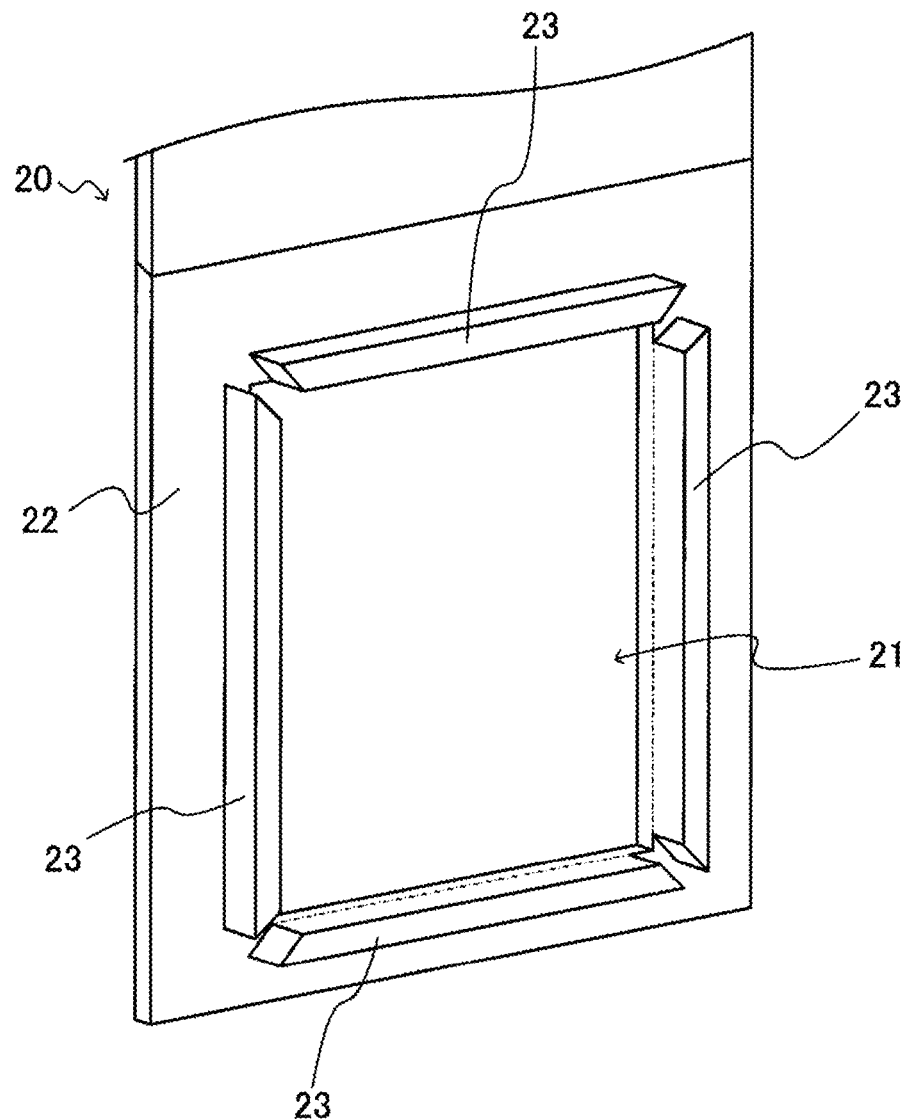
FIG. 3B is a perspective view showing one example of the regulation plate of an embodiment.

FIG. 3A is a diagram showing one example of the regulation plate 20 of the embodiment from the substrate Wf side, and FIG. 3B is a perspective view showing one example of the regulation plate 20. The regulation plate 20 is formed, for example, by a vinyl chloride which is a dielectric. The regulation plate 20 has a plate-like body portion 22 which has a polygon opening (a first polygon opening) 21 on a substantially middle portion, and wall portions 23 which protrude on the substrate holder 30 side from the body portion 22. The polygon opening 21 has a shape following an outer shape of the substrate Wf, such as a shape a little smaller than the outer shape of the substrate Wf, and is quadrilateral in the examples shown in FIG. 3A, 3B. The wall portions 23 protrude from edges of the polygon opening 21 in the body portion 22 along a direction (in FIG. 2, a horizontal direction) perpendicular with respect to a plate surface of the body portion 22. In the examples shown in FIG. 3A, 3B, the wall portions 23 are notched in regions (second regions) containing corner portions of the polygon opening 21. That is, the wall portions 23 are only provided in the regions (first regions) containing middle portions of sides of the polygon opening 21 and are not provided near the corner portions (the second regions). Here, division of the first regions and the second regions may be determined by an experiment, a simulation or the like, and as one example, 2%, 3%, 5%, 7%, or 10% of a region of a surrounding of the polygon opening 21 can be set as the second regions. In addition, as specifically shown in FIG. 3A, the wall portions 23 viewed from the substrate holder 30 side are trapezoidal shapes with outside sides which are longer, for example, ends of the wall portions 23 may be demarcated along straight lines extending radially from the center of the polygon opening 21. However, the wall portions 23 are not limited to this example, for example, a boundary between the first regions and the second regions of the wall portions 23 may also be demarcated along the sides of the polygon opening 21. On such a regulation plate 20, from the anode 12 toward the substrate holder 30, long openings over a relatively long distance (a sum of thickness of the body portion 22 and a height of a wall portion 23) are apparently formed in the regions containing the middle portions of the sides of the polygon opening 21, and short openings over a relatively short distance (thickness of the body portion 22) are formed in near the corners.

If an electric voltage is applied to the substrate Wf and the anode 12 in a state when the regulation plate 20 is accommodated in the electroplating tank 14, the electrical current from the anode 12 passes through the polygon opening 21 and flows to the substrate Wf. In other words, the regulation plate 20 shields one portion of the electric field formed between the anode 12 and the substrate Wf. In addition, the electrical current passing through the polygon opening 21 is suppressed from being guided to the wall portions 23 and extending to the outer side of the substrate Wf. Besides, the wall portions 23 are provided only in the regions (the first regions) containing the middle portions of the sides of the polygon opening 21 in the regulation plate 20 of the embodiment, so that the electrical current is suppressed from flowing near end portions of the substrate Wf in the first regions in particular. On the other hand, the wall portions 23 are notched near the corner portions (the second regions) of the polygon opening 21 in the regulation plate 20, so that compared with the first regions, the electrical current is not suppressed from extending in the second regions. Here, there is a tendency that the electrical current is relatively un-concentrated near the corner portions of the polygon substrate Wf and the electrical current is relatively concentrated near the middle portions of the sides of the substrate Wf. In contrast, by using the regulation plate 20 of the embodiment, the electrical current flowing in the sides of the substrate Wf can be suppressed from being non-uniform, and an in-plane uniformity of membrane thickness can be improved.

Figure 3C:
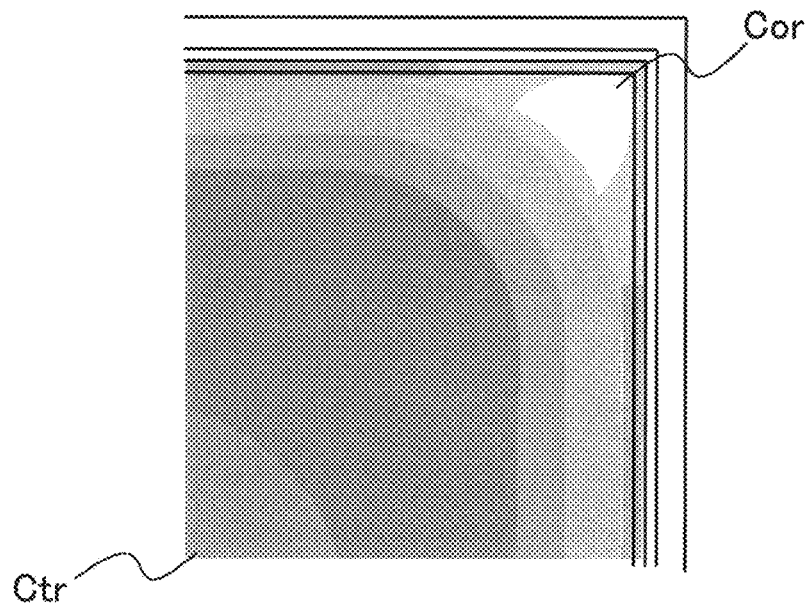
FIG. 3C is a schematic diagram showing electroplating membrane thickness at the time of electroplating a quadrilateral substrate with a regulation plate of a comparison example in which a wall portion with a fixed height is formed.
Figure 3D:
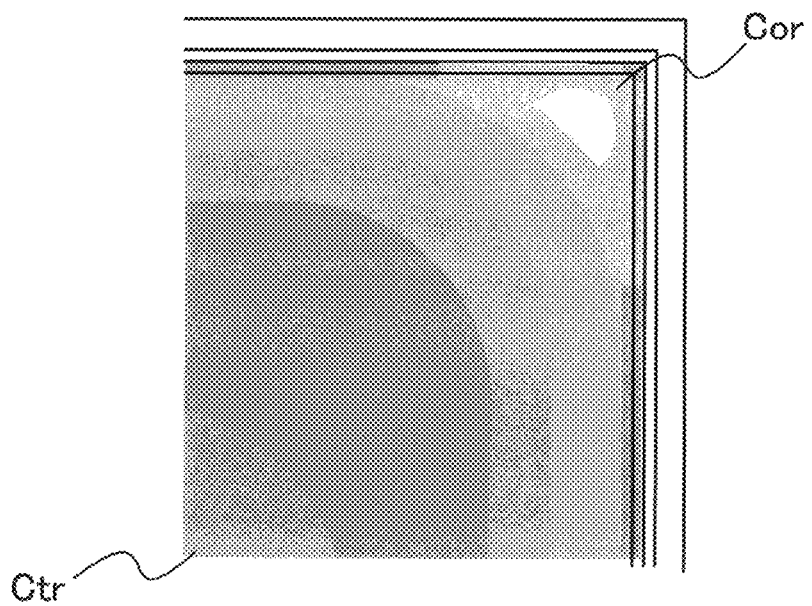
FIG. 3D is a schematic diagram showing electroplating membrane thickness at the time of electroplating a quadrilateral substrate with a regulation plate 20 of embodiments shown in FIG. 3A and FIG. 3B.

FIG. 3C is a schematic diagram showing electroplating membrane thickness at the time of electroplating the quadrilateral substrate by using a regulation plate of a comparison example, in which wall portions with a fixed height are formed, and FIG. 3D is a schematic diagram showing electroplating membrane thickness at the time of electroplating the quadrilateral substrate by using the regulation plate 20 of the embodiment of FIG. 3A and FIG. 3B. Furthermore, in FIG. 3C and FIG. 3D, electroplating membrane thickness of an upper right region when the quadrilateral substrate is divided into four parts is shown, the lower left of the diagram is equivalent to a central portion of the quadrilateral substrate, and the upper right of the diagram is equivalent to a corner portion of the quadrilateral substrate. In FIG. 3C and FIG. 3C, it is shown that the place with a lighter color has a smaller membrane thickness and the place with a deeper color has a greater membrane thickness. As shown in FIG. 3C, when the regulation plate of the comparison example, where the wall portions with a fixed height are formed including the corner portions, is used, the electroplating membrane thickness is small near a corner portion Cor, of which a distance from the central portion Ctr of the substrate is relatively long. In contrast, by using the regulation plate 20 of the embodiment in which the wall portions 23 near the corner portions are notched to electroplate the quadrilateral substrate, as shown in FIG. 3D, the electroplating membrane thickness can be suppressed from becoming small near the corner portion. In addition, compared with the example shown in FIG. 3C, the uniformity (uniformity: (the greatest membrane thickness–the smallest membrane thickness)/2·an average membrane thickness)) of the membrane thickness is improved in the example shown in FIG. 3D. In this way, the in-plane uniformity of the membrane thickness can be improved by using the regulation plate 20 of the embodiment in which the wall portions 23 near the corner portions are notched.

Figure 4:
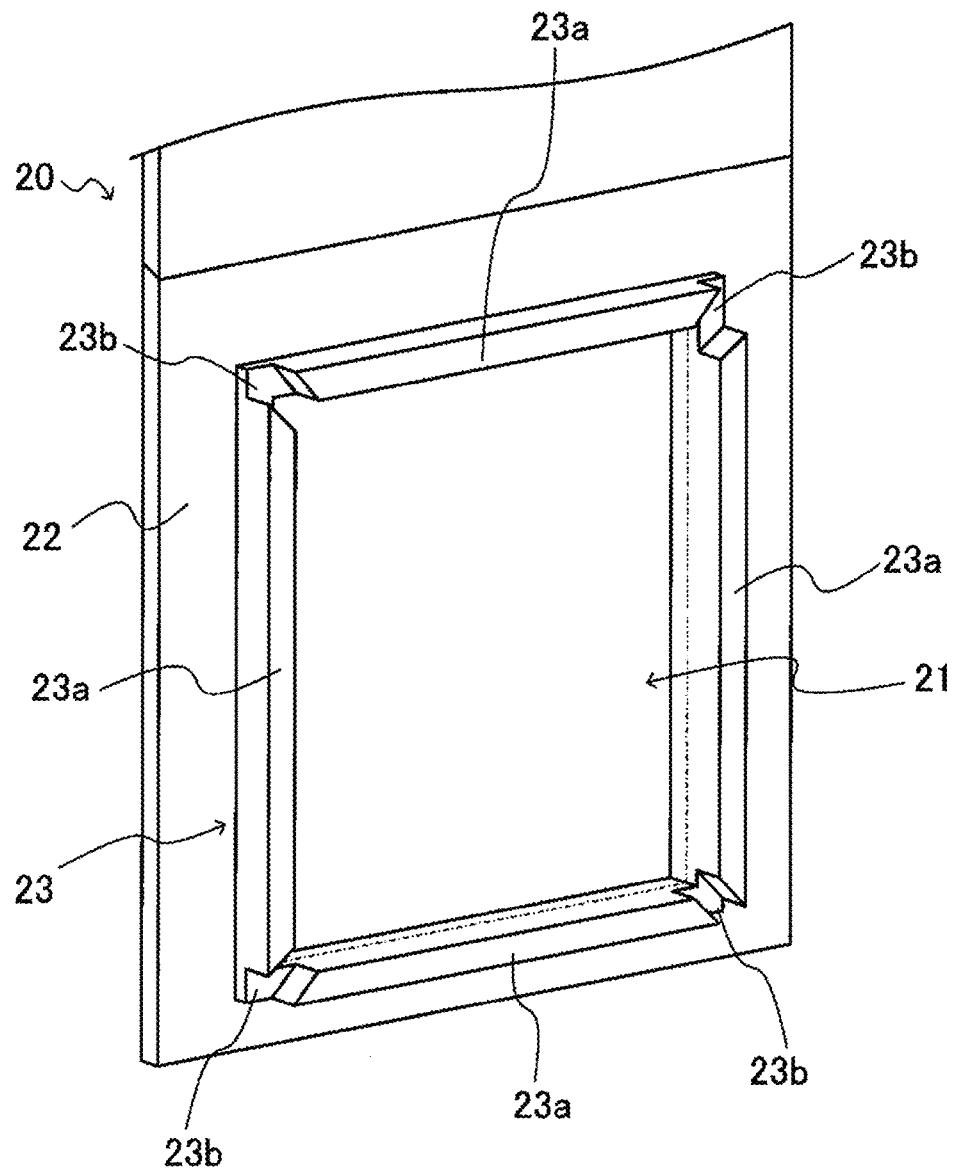
FIG. 4 is a perspective view showing a first variation example of the regulation plate.

FIG. 4 is a diagram showing a first variation example of the regulation plate 20. In the regulation plate 20 shown in FIG. 4, the regulation plate 20 and the wall portions 23 shown in FIG. 3B are different, and the other points are the same. In the regulation plate 20 shown in FIG. 4, the wall portions 23 are provided continuously on overall edges of the polygon opening 21 including the vicinity of the corner portions. However, the wall portions 23 protrude over a first distance in first regions 23a containing middle portions of sides of the polygon opening 21, and protrude over a second distance smaller than the first distance in second regions 23b containing the corner portions of the polygon opening 21. Also, by using such a regulation plate 20, the electrical current flowing near middle portions of the sides of the substrate Wf can be suppressed from being non-uniform and in-plane uniformity of membrane thickness can be improved. Here, a height (the second distance) of the wall portions 23 in the second regions 23b may be defined based on arrangement of power supply members of the substrate holder 30 or the like to improve the in-plane uniformity of the membrane thickness. In addition, the regulation plate 20 in which the height (the second distance) of the wall portions 23 in the second regions 23b is set to a value 0 corresponds to the regulation plate 20 shown in FIG. 3.

Figure 5:
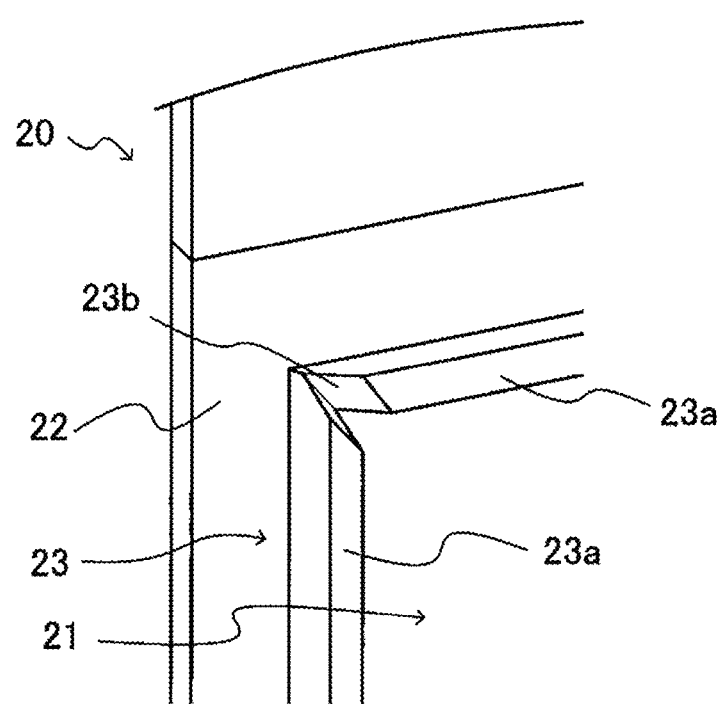
FIG. 5 is a perspective view showing a second variation example of the regulation plate.

FIG. 5 is a diagram showing a second variation example of the regulation plate 20. In the regulation plate 20 shown in FIG. 5, the wall portions 23 in the second regions 23b are formed to be inclined. Inclination angles of the wall portions 23 in the second regions 23b may be determined appropriately by an experiment, a simulation or the like. In the example shown in FIG. 5, the wall portions 23 in the second regions 23b incline lower when getting closer to the corners of polygon opening 21, and incline higher when departing further from the corners of the polygon opening 21. However, the wall portions 23 in the second regions 23b may also incline higher when getting closer to the corners of the polygon opening 21, and incline lower when departing further from the corners of the polygon opening 21. In addition, in the example shown in FIG. 5, the wall portions 23 in the second regions 23b are inclined towards the first region 23a until the same height as the wall portions 23 in the first regions 23a is reached. However, the wall portions 23 are not limited to such an example, and may also inclined in the second regions 23b while having step differences in the first regions 23a and the second regions 23b.

Figure 6:
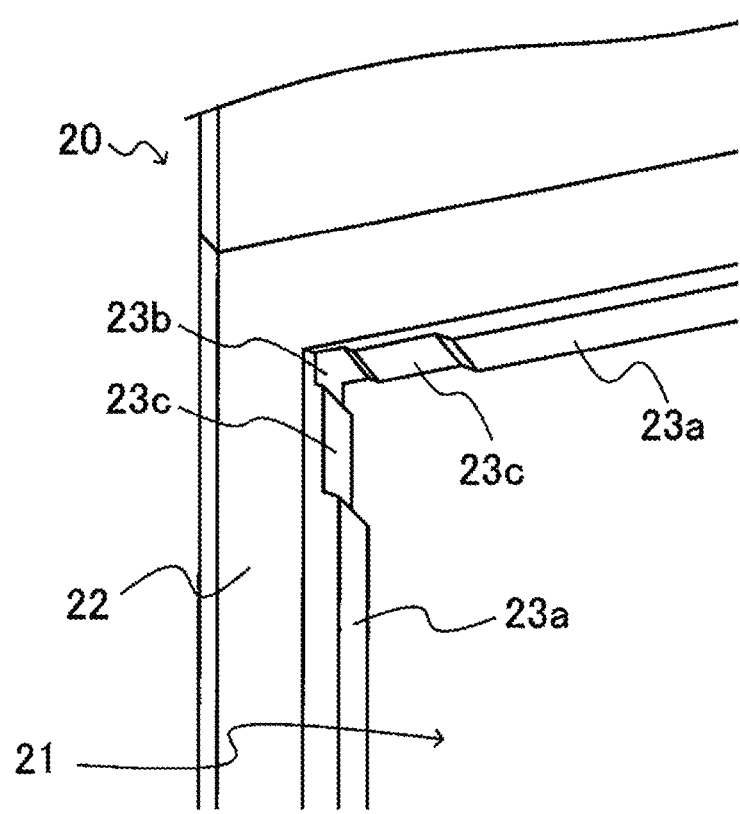
FIG. 6 is a perspective view showing a third variation example of the regulation plate.

FIG. 6 is a diagram showing a third variation example of the regulation plate 20. In the regulation plate 20 shown in FIG. 6, heights of the wall portions 23 are different in the first regions 23a containing middle portions of the sides of the polygon opening 21, the second regions 23b containing the corner portions of the polygon opening 21, and third regions 23c sandwiched by the first regions 23a and the second regions 23b. In the example shown in FIG. 6, the height of the wall portions 23 in the third regions 23c is between the height of the wall portions 23 in the first regions 23a and the height of the wall portions 23 in the second regions 23b. However, the wall portions 23 in the third regions 23c may also be designed to be lower than the height of the wall portions 23 in the second regions 23b.

In addition, the wall portions 23 of the regulation plate 20 may also be smoothly connected in curved shapes or straight line shapes in the first regions 23a and the second regions 23b. In addition, regardless of the first regions 23a or second region 23b, the regulation plate 20 may have holes formed on side surfaces of the wall portions 23.

Return to FIG. 2 for description. A diaphragm 24 is mounted to the regulation plate 20 to block the polygon opening 21. The diaphragm 24 is formed by a cation exchange membrane or a porous membrane which allows metal ions to pass but does not allow additives to pass. An example of such a porous membrane may be a Yumicron (brand name) made by YUASA Membrane Corporation. The diaphragm 24 is fixed to the regulation plate 20 by a frame-shaped fixing board 25 which has an opening corresponding to the polygon opening 21. The diaphragm 24 and the fixing board 25 may be mounted to the regulation plate 20 from a back surface (a surface on the anode 12 side). In addition, a frame-shaped sealing body corresponding to the shape of the polygon opening 21 may be provided on a contact surface between the regulation plate 20 with the diaphragm 24 and/or the fixing board 25.

Furthermore, the regulation plate 20 is described now. However, in place of or in addition to the wall portions 23 of the regulation plate 20, the anode mask 18 mounted to the anode holder 13 may also have wall portions similar to the wall portions 23 of the regulation plate 20. That is, the anode mask 18 may have an anode mask body portion which has a polygon opening (a second polygon opening) 18a following the outer shape of the polygon substrate Wf, and anode mask wall portions which protrude from edges of the polygon opening 18a of the anode mask body portion on the substrate holder 30 side. Besides, the anode mask wall portions may protrude over a third distance on the substrate holder side in third regions which contain middle portions of sides of the polygon opening 18a, and be notched in fourth regions which contain corner portions of the polygon opening 18a, or protrude over a fourth distance smaller than the third distance on the substrate holder 30 side. The polygon opening 18a and the anode mask wall portions in the anode mask 18 may have sizes the same as or different from the polygon opening 21 and the wall portions 23 in the regulation plate 20.

Figure 7:
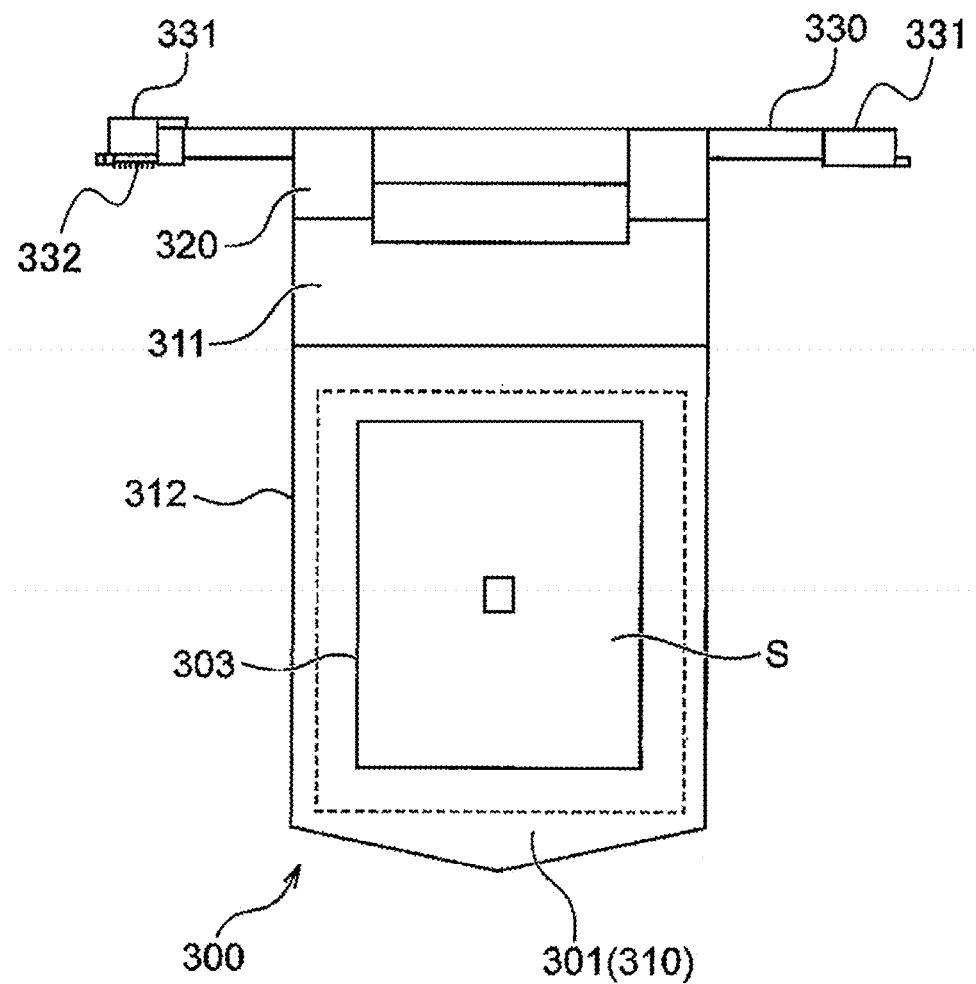
FIG. 7 is a schematic front view of a substrate holder used in the electroplating unit.
Figure 8:
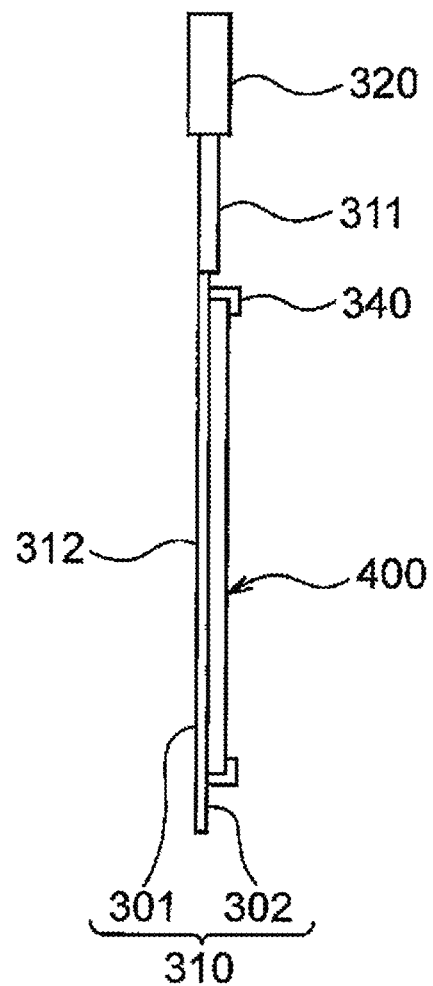
FIG. 8 is a schematic side view of the substrate holder.

Then, the substrate holder 30 is described. FIG. 7 is a schematic front view of the substrate holder 30 used in the electroplating unit 10 shown in FIG. 2, and FIG. 8 is a schematic side view of the substrate holder 30. The substrate holder 30 is provided with a front plate 300 and a back plate 400. The substrate Wf is held between the front plate 300 and the back plate 400. In the implementation example, the substrate holder 30 holds the substrate Wf in a state that one surface of the substrate Wf is exposed.

The front plate 300 is provided with a front plate body 310 and an arm portion 330. The arm portion 330 has a pair of pedestals 331, and the substrate holder 30 is suspended and supported perpendicularly by disposing the pedestals 331 on the upper surface of the peripheral wall of each processing tank shown in FIG. 1. In addition, when the pedestals 331 are disposed on the upper surface of the peripheral wall of the electroplating tank 14, a connector 332 configured to touch the electric contacts provided in the electroplating tank 14 is provided in the arm portion 330. Accordingly, the substrate holder 30 is electrically connected to an outside electric power source, and the electric voltage and the electrical current are applied to the polygon substrate Wf held by the substrate holder 30.

The front plate body 310 is an approximately rectangular shape and has a wiring buffer portion 311 and a face portion 312, a front surface 301 and a back surface 302. The front plate body 310 is mounted to the arm portion 330 at two places by a mounting portion 320. An opening portion 303 is arranged in the front plate body 310 and an electroplated surface of a substrate S is exposed from the opening portion 303. In the embodiment, the opening portion 303 is formed into a shape corresponding to the shape of the polygon substrate.

The back plate 400 is an approximately rectangular shape and covers a back surface of the substrate Wf. The back plate 400 is fixed by a clamp 340 in a state that the substrate Wf is sandwiched between the back plate 400 and the back surface 302 of the front plate body 310 (more specifically, the face portion 312). The clamp 340 is configured to be rotated around a rotation shaft parallel to surfaces 301, 302 of the front plate body 310. However, the clamp 340 is not limited to such an example and may also be configured to move back and forth in a direction perpendicular to the surfaces 301, 302 and clamp the back plate 400.

Figure 9:
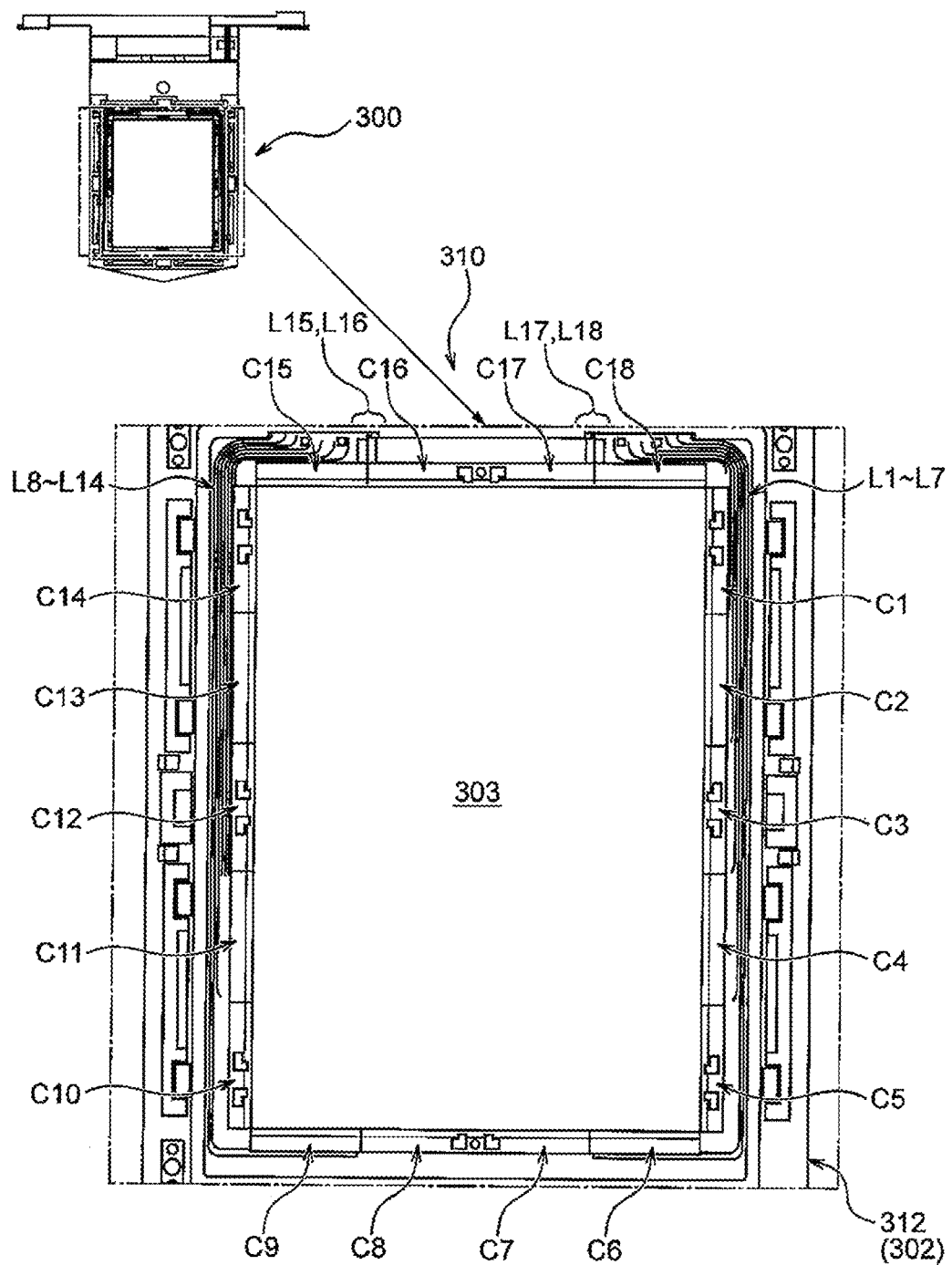
FIG. 9 is a back view of a front plate body.
Figure 10:
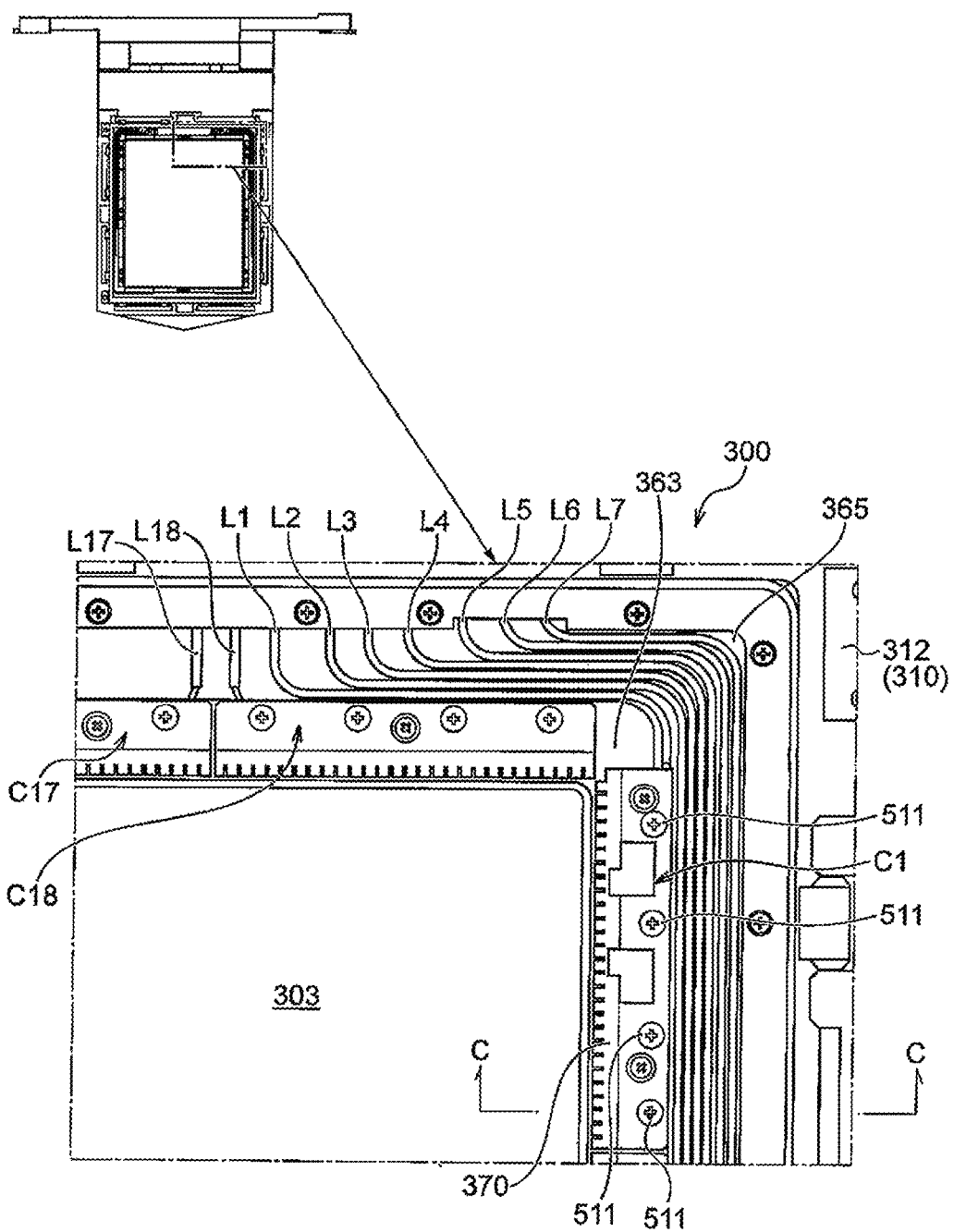
FIG. 10 is a back view showing an enlarged vicinity of a corner portion of a face portion on a side near a connector.

FIG. 9 is a back view of the front plate body, and FIG. 10 is a back view showing an enlarged vicinity of a corner portion of the face portion on a side near the connector. The back surface 302 of the front plate body 310 has 18 contact regions C1-C18. The contact regions C1-C7, C17, and C18 are arranged in the half region (a proximal region, the half region on the right side of FIG. 9) on the connector 332 side and inside the face portion 312, and the contact regions C8-C16 are arrange in the half region (a distal region, the half region on the left side of FIG. 9) on a side away from the connector 332 and inside the face portion 312. In the following description, for convenience, cables arrange in the distal region may be called first group cables, and cables arranged in the proximal region may be called second group cables.

As shown in FIG. 10, contacts (contact members) 370 for supplying power to the substrate Wf are contained in each of the contact regions C1-C18. The contacts 370 are arranged along each side of the opening portion 303 of a front plate 300. That is, the contacts 370 are arranged along each side of the polygon substrate Wf. The power is supplied from outside through cables L1-L18 to the contacts 370 of each of the contact regions C1-C18 respectively. Furthermore, in the following description, when it is not necessary to distinguish each cable, the cables L1-L18 may be called a cable L collectively. In addition, any cable may be referred to as the cable L for reference.

First end portions of the cables L1-L18 are connected to the connector 332 provided on one end of the arm portion 330, and more specifically, are electrically connected to individual contacts in the connector 332, or the first end portions of a plurality of cables are connected to a common contact (omitted in the diagram) in the connector 332. The cables L1-L18 are capable of being electrically connected to an outside electric power source (an electric power source circuit, an electric power source device or the like) via each contact of the connector 332.

The cables L1-L7 are in parallel on the same plane and are introduced into a cable passage 365, and are arranged along the sides of the opening portion 303 on the connector 332 side. The cables do not overlap with each other in a thickness direction of the face portion 312. Therefore, thicknesses of the face portion 312 and the front plate 300 can be suppressed.

The cable L and the contacts 370 in each contact region are electrically connected as follows. Taking a cable L1 as an example, for a tip end portion (a second end portion) of the cable L1, a covering is remove and a core wire (a conductive wire) is exposed. The tip end portion of the cable L1 is introduced into a wiring groove of the seal holder 363 near the contact region C1, and is pressed along with the contact 370 by screws (fastening members) 511 in four places inside the contact region C1. That is, the screws (fastening members) 511 and the seal holder 363 clamp the core wire of the cable L1 and the contact 370. As a result, the cable L1 is electrically connected to the contact 370. When the substrate holder 30 holds the substrate Wf, the contact 370 touches the substrate Wf and the power is supplied from the outside electric power source to the substrate Wf through the cable L1 and the contact 370. The other contact regions C2-C18 are configured similarly, and the power is supplied from the contacts 370 in 18 places to the substrate Wf.

As described above, for the substrate holder 30 of the embodiment, the contacts 370 are provided on each side of the polygon substrate Wf, and the power is supplied from the contacts 370 provided on each side to the substrate Wf. Accordingly, the electroplating membrane is formed on the surface of the substrate Wf.

A process of electroplating the quadrilateral substrate Wf is described above, but the disclosure is not limited hereto and the substrate Wf having three sides, five sides or more can be electroplated by the same process. Even on such an occasion, in the anode mask 18 and the regulation plate 20, a polygon opening having three sides, five sides or more and following the shape of the substrate Wf may be formed, and corner portions of wall portions continuous on the polygon opening may be notched, or protrude over a distance lower than middle portions. In addition, a plurality of power supply members may be arranged along each side of the polygon substrate.

Although the embodiments of the disclosure are described above, the aforementioned embodiments of the disclosure are used to facilitate the understanding of the disclosure and do not limit the disclosure. The disclosure may be changed and modified without departing from the purport, and the disclosure evidently includes its equivalents. In addition, in a range where at least one portion of the problems described above can be solved, or a range where at least one portion of effects can be exhibited, each configuration element recited in the claims and the specification can be combined arbitrarily or be omitted.

What is claimed is:

1. An electroplating device, comprising:
an anode holder, which is configured to hold an anode;
a substrate holder, which is configured to hold a polygon substrate; and
a regulation plate, which is provided between the anode holder and the substrate holder; wherein
the regulation plate has a body portion having a first polygon opening following an outer shape of the polygon substrate, and wall portions protruding on a substrate holder side from edges of the first polygon opening, wherein the wall portions comprises first regions and second regions; and
the wall portions protrude over a first distance on the substrate holder side in the first regions which contain middle portions of sides of the first polygon opening, and are notched in the second regions which contain corner portions of the first polygon opening, or protrude over a second distance smaller than the first distance on the substrate holder side in the second regions which contain the corner portions of the first polygon opening.

2. The electroplating device according to claim 1, wherein the first regions of the wall portions viewed from a direction perpendicular to a plate surface of the body portion are trapezoidal shapes with outside sides which are longer.

3. The electroplating device according to claim 1, further comprising a diaphragm which is arranged to block the first polygon opening of the regulation plate and allows metal ions to permeate and prevents additives from permeating.

4. The electroplating device according to claim 1, further comprising an anode mask mounted to the anode holder, wherein the anode mask has an anode mask body portion having a second polygon opening following the outer shape of the polygon substrate, and anode mask wall portions protruding on the substrate holder side from edges of the second polygon opening, and the anode mask wall portions protrude over a third distance on the substrate holder side in third regions which contain middle portions of sides of the second polygon opening, and are notched in fourth regions which contain corner portions of the second polygon opening, or protrude over a fourth distance smaller than the third distance on the substrate holder side in the fourth regions which contain the corner portions of the second polygon opening.

\* \* \* \* \*